United States Patent
Chou et al.

(10) Patent No.: US 6,214,747 B1
(45) Date of Patent: Apr. 10, 2001

(54) METHOD FOR FORMING OPENING IN A SEMICONDUCTOR DEVICE

(75) Inventors: Hsiao-Pang Chou, Taipei Hsien; Jung-Chao Chiou, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/428,372

(22) Filed: Oct. 28, 1999

(51) Int. Cl.[7] .................... H01L 21/31; H01L 21/336
(52) U.S. Cl. .................. 438/780; 438/963; 438/291; 438/305
(58) Field of Search .................. 438/963, 763, 438/780, 305, 291

(56) References Cited

U.S. PATENT DOCUMENTS

| | | | |
|---|---|---|---|
| 5,933,759 | * 9/1999 | Nguyen et al. | 438/700 |
| 5,942,803 | * 8/1999 | Shim et al. | 257/774 |
| 5,965,463 | * 10/1999 | Cui et al. | 438/723 |

* cited by examiner

Primary Examiner—John F. Niebling
Assistant Examiner—Alexander G. Ghyka
(74) Attorney, Agent, or Firm—Thomas, Kayden, Horstemeyer & Risley

(57) ABSTRACT

A method for forming an opening in a semiconductor device is provided. A silicon-oxy-nitride layer is formed on a dielectric layer and then a photoresist layer with a first opening is formed on the silicon-oxy-nitride layer. A polymer film is formed on sidewalls of the first opening. A second opening narrower than the first opening is formed in the dielectric layer with the photoresist layer and the polymer film.

19 Claims, 1 Drawing Sheet

METHOD FOR FORMING OPENING IN A SEMICONDUCTOR DEVICE

BACKGROUND OF THE INVENTION

1. Field of Invention

The present invention relates to a method for forming a semiconductor device. More particularly, the present invention relates to a method for forming an opening in a semiconductor device.

2. Description of Related Art

The conventional method for forming an opening in a semiconductor device includes the following steps. A photoresist layer is formed on a material layer. Then, the photoresist layer is patterned by the photolithographic process. An etching process is performed to form an opening in the material layer with the patterned photoresist layer.

As the shrinkage in the size of the semiconductor device, the control of critical dimension (CD) in the photolithographic process is the bottleneck in the process due to the limitation of light resolution and depth of focus (DOF). This bottleneck in the photolithographic process limits the formation of a small-size opening. Even with some advance technology such as phase shift mask (PSM), it is still difficult to form a small-size opening.

SUMMARY OF THE INVENTION

The invention provides a method for forming an opening in a semiconductor device to form a small-size opening.

As embodied and broadly described herein, the invention provides a method for forming an opening in a semiconductor device. A silicon-oxy-nitride layer is formed on a dielectric layer, and then a photoresist layer with a first opening is formed on the silicon-oxy-nitride layer. A polymer film is formed on sidewalls of the first opening. A second opening narrower than the first opening is formed in the dielectric layer with the photoresist layer and the polymer film as a mask.

In accordance with the aspect of this invention, a method for forming an opening in a semiconductor device is provided. A silicon-oxy-nitride layer is formed on a dielectric layer and then a photoresist layer with a first opening is formed on the silicon-oxy-nitride layer. By utilizing a gas etchant including $C_4F_8$, CO, Ar and $O_2$, a polymer film is formed on sidewalls of the first opening. Next, a second opening is formed in the dielectric layer by using the photoresist layer and the polymer film as a mask; the second opening is narrower than the first opening.

In this invention, the silicon-oxy-nitride layer is formed on the dielectric layer to be a stop layer; thus, the polymer film can be formed on the sidewalls of the first opening. The second opening is formed by using the photoresist layer and the polymer film as a mask. So that the second opening is narrower than the first opening. A small-size opening is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION OF THE PREFERRED EMBODIMENTS

In the preferred embodiment of the invention, a polymer film is formed on sidewalls of an opening in a photoresist layer. An opening is formed in a dielectric layer by using the photoresist layer and the polymer film as a mask while patterning the dielectric layer; thus, the opening in the dielectric layer is narrower than the opening in the photoresist layer.

To form the polymer film, a silicon-oxy-nitride layer as a stop layer is first formed on the dielectric layer. The dielectric layer is not etched while forming the polymer film due to the silicon-oxy-nitride layer; thus, no oxygenic radicals are released from the dielectric layer to affect the formation of the polymer film.

Figure 1A:
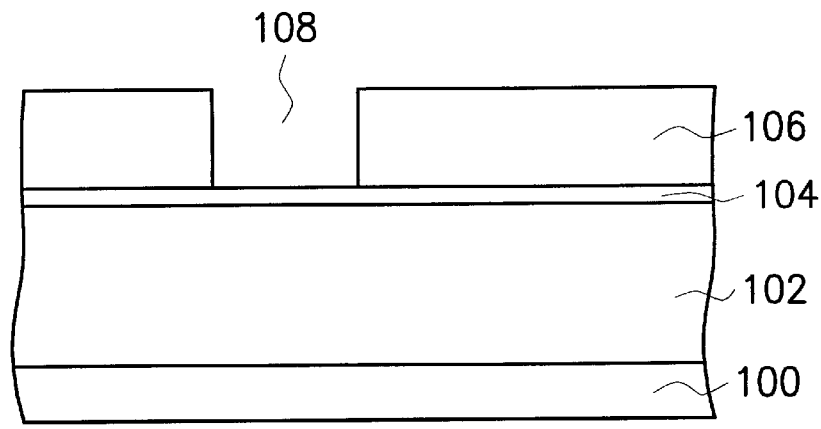
FIGS. 1A, 1B and 1C are schematic, cross-sectional views of a method according to this invention of forming an opening in a semiconductor device.
Figure 1B:
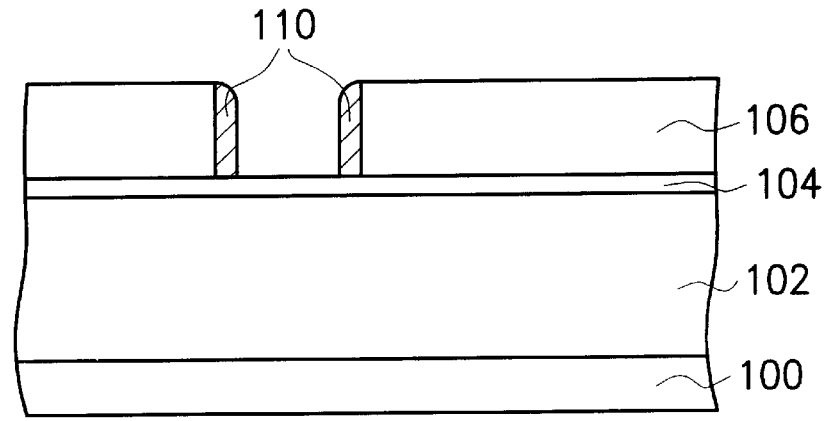
Figure 1C:
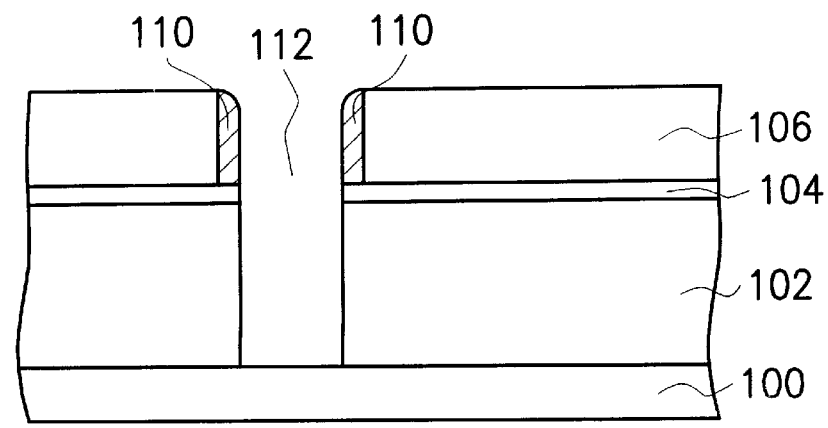

FIGS. 1A through 1C are schematic, cross-sectional views of a method according to this invention of forming an opening in a semiconductor device.

Referring to FIG. 1A, a silicon-oxy-nitride ($SiO_xN_y$) layer 104 whose thickness is about 100–900 Å is formed on a dielectric layer 102 on a substrate 100 by, for example, chemical vapor deposition. The dielectric layer 102 includes silicon dioxide. Then, a photoresist layer 106 is formed on the silicon-oxy-nitride layer 104. An opening 108 is formed in the photoresist layer 106 to expose a portion of the silicon-oxy-nitride layer 104.

The substrate 100 is then placed in a chamber, and a gas etchant at least includes $C_4F_8$ and Ar flows into the chamber; the flow rate of $C_4F_8$ is larger than 10 sccm and the flow rate of Ar is larger than 300 sccm. The gas etchant further includes CO, $O_2$ and $CH_xF_y$ such as $CHF_3$, $CH_2F_2$ or $CH_3F$; the flow rate of CO is about 0–500 sccm and the flow rate of $O_2$ is about 0–3 sccm. A plasma generator such as radio frequency (RF) is utilized to generate plasma and a polymer film 110 is in-situ deposited on sidewalls of the opening 108 as shown in FIG. 1B. The power of the plasma generator is set to about 1600W, and the temperature of the bottom electrode of the plasma generator is about 10° C.

Since the material of the dielectric layer 102 is generally silicon dioxide, oxygenic radicals are released from the dielectric layer 102 while etching the dielectric layer 102 to form an opening with the gas etchant containing fluorine ions. At the same time, polymer is also produced. However, the polymer is uneasily deposited on the sidewalls of the opening 108 due to the oxygenic radicals. In this embodiment, the silicon-oxy-nitride layer 104 with a sufficient thickness is as a stop layer to prevent the dielectric layer 102 from etching; thus, no oxygenic radicals are released from the dielectric layer 102. The polymer can be deposited on the sidewalls of the opening 108.

Carbon contained in $C_4F_8$ reacts with hydrogen contained in the photoresist layer 106 to produce the polymer film 110. $CH_xF_y$ can assist the formation of the polymer film 110. As a result, the thickness of the polymer film 110 is controlled by the flow rate of $C_4F_8$ in the gas etchant, and the ratio of hydrogen contained in $CH_xF_y$ controls the densification of the polymer film 110. When the ratio of hydrogen contained in $CH_xF_y$ is high, the polymer film 110 is thicker but is loose. However, the densification of the polymer film 110 is not related to the use of the polymer film 110.

While the polymer film 110 is deposited on the sidewalls of the opening 108, the polymer deposited on the silicon-oxy-nitride layer 104 is bombarded away at the time due to sufficient argon in the gas etchant. So that no polymer is deposited on the silicon-oxy-nitride layer 104 exposed by the opening 108.

After the polymer film 110 is deposited on the sidewalls of the opening 108, an etching process is performed with the photoresist layer 106 and the polymer film 110 as a mask to remove a portion of the silicon-oxy-nitride layer 104 and a portion of the dielectric layer 102 by changing the flow rate of the gas etchant; thus, an opening 112 is formed in the dielectric layer 102. The gas etchant preferably includes $C_4F_8$, CO, Ar and $O_2$; for example, the flow rate of $C_4F_8$ is about 12 sccm, the flow rate of CO is about 50 sccm, the flow rate of Ar is about 250 sccm and the flow rate of $O_2$ is about 5 sccm. The pressure in the chamber is about 30 mtorr.

Since the polymer film 110 is as a spacer on the sidewalls of the opening 108, the opening 112 is narrower than the opening 108. As a result, a small-size opening is obtained. In addition, the silicon-oxy-nitride layer 104 on the dielectric layer 102 is also used as an anti-reflective-coating layer (ARC) to avoid misalignment during the patterning process. Next, the photoresist layer 106 is removed.

In this invention, the silicon-oxy-nitride layer is formed on the dielectric layer to be a stop layer; thus, the polymer film can be formed on the sidewalls of the opening in the photoresist layer. The photoresist layer and the polymer film are used as a mask to form the opening in the dielectric layer, which is narrower than the opening in the photoresist layer. So that a small-size opening is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming an opening in a semiconductor device, comprising the steps of:
    forming an insulation layer on a substrate;
    forming a stop layer on the insulation layer;
    forming a photoresist layer with a first opening on the stop layer to expose the stop layer;
    forming a polymer film only on sidewalls of the first opening in the photoresist layer;
    forming a second opening in the insulation layer with the photoresist layer and the polymer film as a mask; and
    removing the photoresist layer.

2. The method of claim 1, wherein a thickness of the stop layer is about 100–900 Å.

3. The method of claim 1, wherein the second opening is narrower than the first opening.

4. The method of claim 1, wherein the polymer film on the sidewalls of the first opening is formed by utilizing a gas etchant.

5. The method of claim 4, wherein the gas etchant includes $C_4F_8$, CO, Ar and $O_2$.

6. The method of claim 4, wherein the gas etchant includes $CH_xF_y$, wherein $CH_xF_y$ is selected from a grou consisting of $CHF_3$, $CH_2F_2$, $CH_3F$, and a combination thereof.

7. The method of claim 1, wherein a thickness of the stop layer includes silicon-oxy-nitride.

8. A method for forming an opening in a semiconductor device, comprising the steps of:
    providing a substrate with an insulation layer;
    forming a silicon-oxy-nitride layer on the insulation layer;
    forming a photoresist layer on the silicon-oxy-nitride layer;
    forming a first opening in the photoresist layer to expose a portion of the silicon-oxy-nitride layer;
    placing the substrate in a chamber and flowing a gas etchant into the chamber, thereby a polymer film is formed only on sidewalls of the first opening in the photoresist layer;
    removing the portion of the silicon-oxy-nitride layer;
    forming a second opening in the insulating layer with the photoresist layer and the polymer film as a mask, wherein the second opening is narrower than the first opening; and
    removing the photoresist layer.

9. The method of claim 8, wherein a thickness of the silicon-oxy-nitride layer is sufficient to prevent from etching.

10. The method of claim 9, wherein a thickness of the-silicon-oxy-nitride layer is about 100–900 Å.

11. The method of claim 8, wherein the gas etchant at least includes $C_4F_8$ and Ar.

12. The method of claim 11, wherein a flow rate of $C_4F_8$ is larger than 10 sccm.

13. The method of claim 11, wherein a flow rate of Ar is sufficient to bombard away a part of the polymer film on the silicon-oxy-nitride layer exposed by the first opening.

14. The method of claim 13, wherein the flow rate of Ar is larger than 400 sccm.

15. The method of claim 8, wherein the gas etchant includes CO, $O_2$ and $CH_xF_y$, wherein $CH_xF_y$ is selected from a group consisting of $CHF_3$, $CH_2F_2$, $CH_3F$, and a combination thereof.

16. The method of claim 15, wherein a flow rate of CO is about 0–500 sccm and a flow rate of $O_2$ is about 0–3 sccm.

17. The method of claim 8, wherein the chamber includes a plasma chamber.

18. The method of claim 8, wherein a pressure in the chamber is about 50–100 mtorr.

19. The method of claim 8, wherein the insulating layer includes silicon dioxide.

* * * * *